United States Patent [19]

Puskas

[11] Patent Number: 4,743,789
[45] Date of Patent: May 10, 1988

[54] VARIABLE FREQUENCY DRIVE CIRCUIT

[76] Inventor: William L. Puskas, P.O. Box 1676, N. Pleasant St., New London, N.H. 03257-1676

[21] Appl. No.: 2,732

[22] Filed: Jan. 12, 1987

[51] Int. Cl.[4] .................................. H01L 41/08
[52] U.S. Cl. ...................... 310/316; 310/317; 310/319; 318/118; 307/633; 363/16; 363/131
[58] Field of Search .................. 310/314, 316–319, 310/26; 318/116, 118; 331/107 R, 107 A, 116 R, 155, 157, 158; 363/16, 49, 131; 323/355; 307/633

[56] References Cited

U.S. PATENT DOCUMENTS

| | | | |
|---|---|---|---|
| 3,152,295 | 10/1964 | Schebler | 318/118 |
| 3,629,726 | 12/1971 | Popescu | 331/157 X |
| 3,651,352 | 3/1972 | Puskas | 310/316 |
| 3,668,486 | 6/1972 | Silver | 318/116 |
| 3,681,626 | 8/1972 | Puskas | 310/316 |
| 3,975,650 | 8/1976 | Payne | 310/316 |
| 4,109,174 | 8/1978 | Hodgson | 310/316 |
| 4,141,608 | 2/1979 | Breining | 310/26 X |
| 4,264,837 | 4/1981 | Gaboriaud | 310/316 |
| 4,551,690 | 11/1985 | Quist | 310/316 |
| 4,554,477 | 11/1985 | Ratcliff | 310/316 |
| 4,588,917 | 5/1986 | Ratcliff | 310/316 |

FOREIGN PATENT DOCUMENTS

| | | | |
|---|---|---|---|
| 2060220 | 4/1981 | United Kingdom | 363/16 |
| 2161037 | 1/1986 | United Kingdom | 361/16 |
| 2170663 | 8/1986 | United Kingdom | 363/16 |

OTHER PUBLICATIONS

GE SCR Manual, Sixth Edition, 1979, pp. 354 to 356.

*Primary Examiner*—Mark O. Budd
*Attorney, Agent, or Firm*—Lahive & Cockfield

[57] ABSTRACT

An AC power system for a resonant load. A pair of switching networks and blocking networks are provided to drive the load for half a cycle in a resonant manner to a high energy state, and then maintained in that high energy state for a predetermined period. Then the load is driven for half a cycle in a resonant manner to the opposite polarity high energy state, and maintained in that high energy state for the predetermined period. A controller adjustably controls the frequency of switching between the two high energy states and the length of the predetermined period, so that a desired frequency is obtained.

37 Claims, 8 Drawing Sheets

VARIABLE FREQUENCY DRIVE CIRCUIT

BACKGROUND OF THE INVENTION

The present invention is in the field of AC power systems and, more particularly, the present invention relates to adjustable frequency power generators, for example, of a type suitable for driving ultrasonic transducers.

In the prior art, power ultrasonic generators for driving resonant loads have principally been of the self resonant type. In such generators, a feedback signal from the resonant load to the power driver, or oscillator, automatically sets the drive frequency to the electrical resonant frequency (or to one of the electrical resonant frequencies when more than one exists). The desired drive frequency for the transducer is obtained by designing the electrical resonance of the output resonant circuit to have its primary resonant frequency equal to the desired drive frequency. Examples of this type of generator are found in U.S. Pat. Nos. 3,651,352 and 3,681,626. With the above type of circuits, if precise control of the drive frequency is desired, a method to change the output circuit resonant frequency must be incorporated; this is generally expensive and the response to changes is slow. Further, for generators without drive frequency control, when the environmental conditions (e.g. temperature changes) cause characteristics of the resonant components to change, the drive frequency also changes. This can cause the drive frequency to move out of its acceptable operating range for the transducer.

In the prior art, the Class A SCR inverter circuit (for example, as set forth in GE SCR Manual, Sixth Edition, 1979, pages 354 to 356) overcomes certain of these disadvantages. That circuit automatically matches the resonant frequency of the output to the drive frequency by using a single inductor or two inductors in parallel, for the required amount of time during each cycle. For example, when a higher drive frequency is employed, the time that the two inductors are in parallel is increased, thereby raising the equivalent electrical resonant frequency. The primary disadvantage of this circuit for power ultrasonic generators is that stored output reactive energy is returned to the input power supply during the time that the two inductors are in parallel. This extra flow of energy from output to input then back to the output necessitates higher current rated power semiconductor devices, thereby adding cost to the system.

An alternate approach to the problem of controlling the power drive frequency to reactive loads, is to not make the load resonant, but to drive the reactance directly and dump the stored reactive energy each half cycle. However, this approach is characterized by high inefficiency. As a consequence, this approach is impractical for all but the lowest power ultrasonic generators.

It is an object of the present invention to provide an improved AC power system for driving resonant loads.

Another object is to provide an improved AC power system characterized by high efficiency.

Yet another object is to provide an improved AC power system which automatically compensates for different drive frequencies and varying electrical resonant frequencies, without the need for adjustable reactive components in the output network.

Still another object is to provide an improved AC power system which transfers energy substantially only from the power supply to the load throughout each cycle of operation.

SUMMARY OF THE INVENTION

Briefly, the present invention is an AC power system adapted to impress an AC voltage at a frequency f across a capacitive element characterized by a predetermined capacitance C and having a first terminal and a second terminal, where the second terminal is coupled to a first reference potential, for example, ground potential.

In one form of the invention, the system includes a first inductive element characterized by a predetermined inductance L1 and a second inductive element characterized by an inductance L2. Each inductor has a first terminal and a second terminal. The two inductive elements are mutually coupled so that a current flowing from the first terminal in one of the inductive elements towards its second terminal induces a similarly directed current between the first and second terminals of that other inductive element. The second terminals of the inductive elements are coupled to the first terminal of the capacitive element so that the first inductive element is electrically resonant with the capacitive element substantially at a resonant frequency $f_{r1}$ ($=1/T_{r1}$) and the second inductive element is electrically resonant with the capacitive element substantially at a resonant frequency $f_{r2}(=1/T_{r2})$.

A first drive network includes a first multi-state switch network and a first blocking network coupled in series with the first inductive element between a second reference potential and the capacitive element. A second drive network includes a second multi-state switch network and a second blocking network coupled in series with the second inductive element between a third reference potential and the capacitive element.

The first drive network and first inductive element provide a unidirectional current flow path characterized by a first relatively low impedance from the second potential to the capacitive element when the first switch network is in a first state. Those elements provide an oppositely directed current flow path characterized by a second relatively low impedance between the capacitive element and the second potential when the switch network is in a second state. The first relatively low impedance is lower than the second relatively low impedance.

Similarly, the second drive network and the second inductive element provide a unidirectional current flow path characterized by a third relatively low impedance from the capacitive element to the third potential when the second switch network is in a first state. An oppositely directed current flow path characterized by a fourth relatively low impedance is provided between the third potential and the capacitive element when the switch network is in a second state. The third relatively low impedance is lower than the fourth relatively low impedance.

The system further includes a controller for cyclically switching the first switch network between its first and second states at a frequency f ($=1/T$), where $(T_{r1}/2)+(T_{r2}/2)$ is less than T. In operation, the first switch network is in its first state for a period substantially equal to $T_{r1}/2$ at the beginning of each cycle and is in its second state for the remainder of each cycle. The controller further cyclically switches the second switch network between its first and second states at the frequency f so that the second switch network is in its first state for a period substantially equal to $T_{r2}/2$ at the beginning of each cycle and is in its second state during the remainder of each cycle. The controller establishes the start time of each cycle of the second switch network to be offset by at least $T_{r1}/2$ and less than D from the start time of each cycle of the first switch network, where D is substantially equal to $T-(T_{r1}/2)-(T_{r2}/2)$. As a consequence of this switching operation controlled by the controller, an AC voltage at frequency f is impressed across the capacitive element.

In one form of the invention, L1 is substantially equal to L2 and $T_{r1}$ is substantially equal to $T_{r2}$. Where the offset equals T/2 in this case, the AC voltage impressed across the capacitive element is generally symmetrical about a baseline value, and periodically rises in a substantially sinusoidal manner (at frequency $f_{r1}=f_{r2}$) to a high peak value, stays substantially at the peak value (except for droop due in part to leakage in the capacitive element for a period D/2), and then falls in a substantially sinusoidal manner (at frequency $f_{r1}=f_{r2}$) to low peak value, and then remains substantially at that value for a period D/2.

In various forms of the invention, the capacitive element may be an electrostrictive device, such as an ultrasonic transducer. Alternatively, at least one of the inductive elements may be a magnetostrictive device, such as an ultrasonic transducer, with the capacitive element being a capacitor.

In another form of the invention, an AC power system may also include a capacitive element characterized by a predetermined capacitance and having first and second terminals, with the latter being coupled to a first reference potential, such as ground. This form of the invention includes an inductive element coupled to be electrically resonant substantially at a frequency equal to $f_r(=1/T_r)$. A first drive network is coupled between a first reference potential and the inductive element, and a second drive network is coupled between a second reference potential and the inductive element.

In this form, the first drive network includes a first multi-state switch network and a first blocking network in series between the second reference potential and the inductive element. Similarly, the second drive network includes a second multi-state switch network and a second blocking network in series between the third reference potential and the inductive element. In this configuration, the first and second drive networks provide similarly directed current flow paths as in the earlier described form of the invention. A controller operates to control the states of the switch networks in the same manner as that described above for the earlier described form of the invention (where $T_{r1}=T_{r2}$).

With all forms of the invention described above, the AC voltage impressed across the capacitive element has a frequency f which may be adjustably controlled by controlling the switching frequency of the switch networks.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
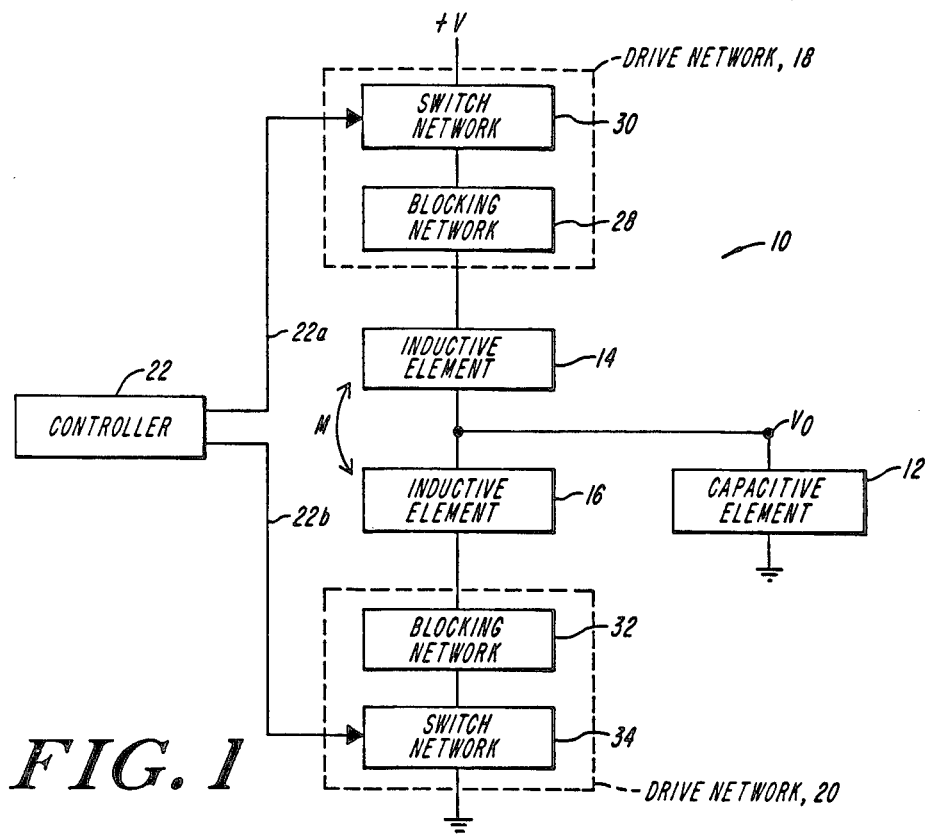
FIG. 1 shows in block diagram form an AC power system embodying the present invention.

FIG. 1 shows, in block diagram form, an AC power system 10 embodying the present invention. The power system 10 includes a capacitive element 12 with one terminal coupled to ground potential, a pair of mutually coupled inductive elements 14 and 16, drive networks 18 and 20, and a controller 22.

The inductive elements 14 and 16 are preferably loosely coupled (with a coupling coefficient M) so that a current in the inductive element 14 in the direction toward the capacitive element 12 induces a current in the inductive element 16 toward the capacitive element 12. With this configuration, the voltage across inductive element 14 equals the product of the inductance L1 of that element 14 times the rate of change of current in that element plus the product of the mutual inductance M times the rate of change of current in the inductive element 16. The voltage across inductive element 16 similarly equals the product of the inductance L2 of that element 16 times the rate of change of current in that element plus the product of M times the rate of change of current in the inductive element 14.

As shown, the drive network 18 and the drive network 20 are respectively coupled between one of the inductive elements 14 and 16 and one of two reference potentials denoted by +V and ground in FIG. 1. In various embodiments of the invention, the relative positions of the inductive element 14, blocking network 28 and switch network 30 may be changed, as may be the relative positions of the inductive element 16, blocking network 32 and switch network 34.

The drive network 18 includes a blocking network 28 and a multi-state switch network 30, which is coupled to the controller 22 by way of line 22a. The drive network 20 includes a blocking network 32 and a multi-state switch network 34, which is coupled to the controller 22 by way of line 22b.

In the presently described embodiment, L1=L2 and the inductive element 14 is coupled to the capacitive element 12 so as to be electrically resonant with that capacitive element substantially at a resonant frequency $f_{r1}(=f_r)$. Similarly, the inductive element 16 is coupled so as to be electrically resonant with the capacitive element 12 at substantially the same resonant frequency $f_{r2}(=f_{r1}=f_r)$.

In drive network 18, the blocking network 28 and switch network 30 provide a unidirectional current flow path characterized by a relatively low impedance from the potential +V to the inductive element 14 when the switch network 30 is in a first (conductive) state. The networks 28 and 30 provide an oppositely directed relatively low impedance current flow path from that inductive element 14 to the potential +V when the switch network 30 is in a second (conductive) state. The impedance of the flow path established when network 30 is in its first state is lower than the impedance of the flow path established when the network 30 is in its second state.

Similarly, the blocking network 32 and switch network 34 provide a unidirectional current flow path characterized by a relatively low impedance when the switch network is in a first (conductive) state, and an oppositely directed relatively low impedance current flow path when the switch network 34 is in a second (conductive) state. As with the drive network 18, the impedance of the flow path established when network 32 is in its first state is lower than the impedance of the flow path established when the network 32 is in its second state.

The relatively low impedance (Z) of drive network 18 when switch network 30 is in its second state may be primarily determined by a resistor (R), in which case Z has a value substantially equal to R for current flow in a direction away from the capacitor and "near-infinity" (i.e. relatively high) for current flow toward the capacitor. In other embodiments, Z may be non-linear, normally lower at the beginning of operation in the second state and higher at times after the second state begins. For example, a metal oxide varistor (MOV) in parallel with a resistor (R) may be the primary determining factor for Z. In this case, at the beginning of operation in the second state when the voltage across Z is high, the low impedance of the on MOV primarily determines Z and later in the second state, as the voltage drops below the MOV's breakdown potential, Z is primarily determined by R.

A similar situation occurs for the relatively low impedance of drive network 20 when switch network 34 is in its second state, except that current flow toward the capacitor encounters the linear or non-linear relatively low impedance and current flow away from the capacitor encounters the "near-infinity" impedance.

The capacitive element 12 and the inductive elements 14 and 16 may have different forms in various embodiments. For example, where the AC power system 10 is adapted to drive an ultrasonic transducer, the capacitive element 12 may be an electrostrictive device suitable for use as an ultrasonic transducer, and the inductive elements 14 and 16 may be inductors which are mutually coupled by a coefficient indicated by the reference designation M in FIG. 1. In this form, additional capacitive elements may be placed in parallel with the electrostrictive device in order to form a relatively high effective Q for that capacitive element 12. In another form of the invention, one or both of the inductive elements 14 may be magnetostrictive devices, for example, having the form of ultrasonic transducers, and the capacitive element 12 may be a capacitor.

With these configurations, the controller 22 may effectively control the system 10 to drive such ultrasonic transducers at a selectively controlled frequency. In various forms of the invention, the controller 22 may be adaptively controlled so as to track variations in the resonant frequency for the respective ultrasonic transducers.

In operation, the controller 22 cyclically switches the switch network 30 between its first and second states at a frequency $f$ ($=1/T$), where $f$ is less than or equal to $f_r$ ($=1/T_r$). During each cycle, network 30 is controlled to be in its first state for a period substantially equal to $T_r/2$ at the beginning of each cycle. Network 30 is controlled to be in its second state for the remainder of each cycle.

Similarly, the controller 22 also cyclically switches the switch network 32 between its first and second states at the frequency $f$ ($=1/T$). During each cycle, network 32 is controlled to be in its first state for a period substantially equal to $T_r/2$ at the beginning of each cycle. Network 32 is controlled to be in its second state for the remainder of each cycle. In the presently described embodiment, the start time for each cycle of the switching of network 30 is offset by $T/2$ from the start time for each cycle of the switching of network 32. In other forms, the start time for the cycle of the switching network 30 may be offset by at least $T_r/2$ and less than $T_r/2+D$, where D equals $T-T_r$.

With the present embodiment, in response to this operation, an AC voltage waveform ($V_o$) at frequency $f$ is impressed across the capacitive element 12. Generally, this voltage waveform $V_o$ passes from low to high and from high to low with a sinusoidal waveshape (at frequency $f_r$). After rising from its low peak level to its high peak level, the voltage waveform stays substantially at its high peak level (except for droop due to resistive losses) for a period $\frac{1}{2}(T-T_r)$, or $D/2$, before passing from that high peak level to its low peak level. Similarly, upon returning to the low peak level, the voltage waveform $V_o$ remains at that level (except for droop due to resistive losses) for a period $\frac{1}{2}(T-T_r)$, or $D/2$, before again passing to the high peak level.

Thus, the voltage impressed across capacitive element 12 rises and falls at the resonant frequency $f_r$ with the capacitive element 12 being maintained in its fully charged state for a "dead" time which is adjustably dependent upon the switching frequency $f$ of the controller 22. Accordingly, the drive frequency to the element 12 may be adjustably controlled.

In the general case, L1 and L2 differs and the resonant frequencies $f_{r1}$ ($=1/T_{r1}$) and $f_{r2}$ ($=1/T_{r2}$) differ. In that general case, the voltage impressed on element 12 rises sinusoidally at frequency $f_{r1}$ and falls at frequency $f_{r2}$.

Where the element 12 is an ultrasonic transducer, the network 10 may be used to drive that transducer at a frequency adjusted to match the optimal drive frequency. In various embodiments, variations in that optimal drive frequency may be deleted and the controller may be adjusted in closed loop fashion to adaptively track such variations.

Figure 2:
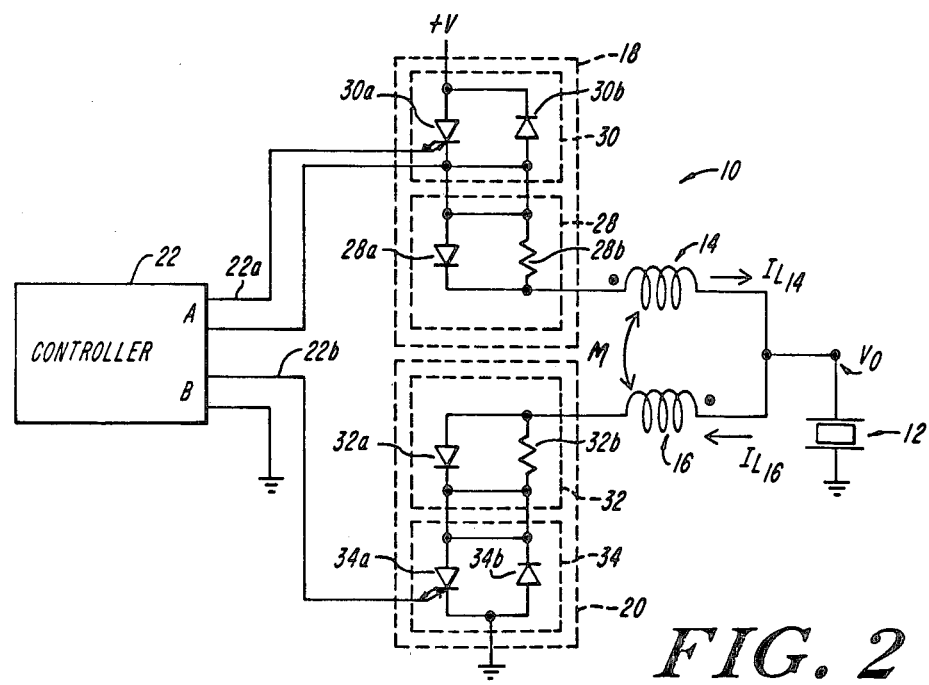
FIG. 2 shows in schematic form an embodiment of the system of FIG. 1.

FIG. 2 shows a simplified schematic representation of the system 10 of FIG. 1 in which the inductive elements 14 and 16 are coupled inductors and the capacitive element 12 is an electrostrictive device, namely an ultrasonic transducer. In FIG. 2, elements which correspond to elements in FIG. 1 are identified with the same reference designations.

In FIG. 2, the mutual inductance for inductors 14 and 16 is denoted by M, and the "dot" convention whereby current through inductor 14 towards the capacitive element 12 induces a current in inductor 16 toward the capacitive element 12.

Blocking network 28 includes a diode 28a in parallel with a resistor 28b, and the blocking network 32 includes a diode 32a and a resistor 32b. The switch network 30 includes a gate turn-off thyristor (GTO) 30a having a diode 30b coupled across its output terminals and the switch network 34 includes a GTO 34a having a diode 34b coupled across its output terminals. The gates of each GTO are coupled by way of a respective one of lines 22a and 22b to the controller 22.

With this configuration, when the GTO 30a is in its conductive or "ON" state, the networks 28 and 30 establish a unidirectional low impedance current flow path by way of the GTO 30a and diode 28a through the inductive element 14 toward the capacitive element 12. When the GTO 30a is in its non-conductive or "OFF" state, the networks 28 and 30 establish a relatively low impedance current flow path from the capacitive element 12 by way of the inductive element 14 and the resistor 28b and diode 30b to the applied potential $+V$. The lower half of the circuit shown in FIG. 2 operates in substantially the same manner in response to the state established by the GTO 34a.

Figure 3A:
FIGS. 3A-3E and FIGS. 4A-4E show waveforms illustrating the operation of the system of FIG. 2.
Figure 3B:
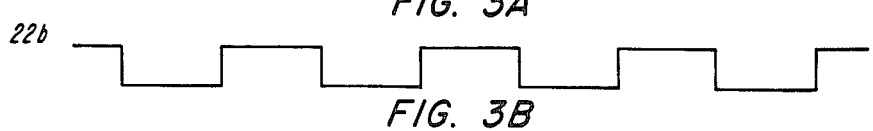

FIGS. 3A–3E show waveforms which illustrate the operation of the system 10 of FIG. 2 at the uppermost frequency, where $f(=1/T)$ equals the electrical resonant frequency $f_r(=1/T_r)$ of inductors 14 and 16 with capacitive element 14. FIGS. 3A and 3B represent the signals on lines 22a and 22b, respectively, where the "high" portion of each of those signals represents the times (of duration $T_r/2$) when the respective ones of switch devices 30a and 34a are in their conductive state and the "low" portion of each of these signals represents the times when those devices are in their non-conductive states.

As shown in FIG. 2, the switch devices 30a and 34a are gate turn-off thyristors (GTO's) but in alternate embodiments, those switch devices may be silicon controlled rectifiers (SCR's), bipolar junction transistors (BJT's), field effect transistors (FET's), insulated gate transistors (IGT's), vacuum tubes, or other suitable switch devices. For each such device, it will be understood that the actual switch signals provided by controller 22 on lines 22a and 22b will have the appropriate waveform to accomplish the functional on-off operation depicted by FIGS. 3A and 3B. As described below, FIGS. 11 and 12 set forth a circuit configuration and illustrate the operations thereof, respectively, which is preferred for controlling the states of GTO's 30a and 34a.

Figure 3C:
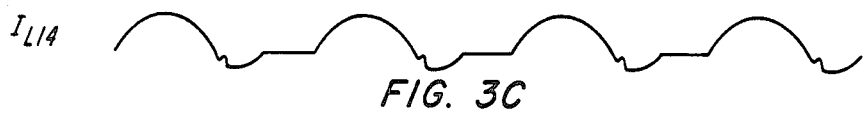
Figure 3D:

FIGS. 3C and 3D represent the current flow through the inductive elements 14 and 16, respectively. For element 14, during the conductive times of the switch device 30a, the current $I_{L14}$ rises and falls for $T_r/2$ in an approximately sinusoidal fashion at the resonant frequency $f_r$. At the beginning of the non-conductive times of the switch device 30a, the current $I_{L14}$ initially peaks in the negative direction (due to losses in the voltage $V_o$). Then that current $I_{L14}$ rises and falls in the negative sense due to the coupling M as the current $I_{L16}$ rises in the inductive element 16. This "negative" current passes through diode 30b and provides a reverse voltage drop across switch 30a, thereby ensuring that the switch has sufficient turn-off time and therefore stays in its OFF state. As the current $I_{L16}$ decreases in the element 16, the diode 30b prevents substantial current from flowing in element 14. Inductive element 16 behaves in a similar fashion for the conductive and non-conductive times respectively, for the switch 34a.

For the case illustrated in FIGS. 3A–3E, where $L1=L2$ and $f_{r1}=f_{r2}=f$ (and thus $D=0$), the output voltage $V_0$ is substantially sinusoidal (when element 12 has a high Q).

In other cases, where D is greater than zero, the output voltage is less sinusoidal-like, depending in part on the value of D and the respective resonant frequencies $f_{r1}$ and $f_{r2}$, as well as the magnitude of the offset of the start time for network 20 with respect to network 18.

Figure 3E:
Figure 4A:
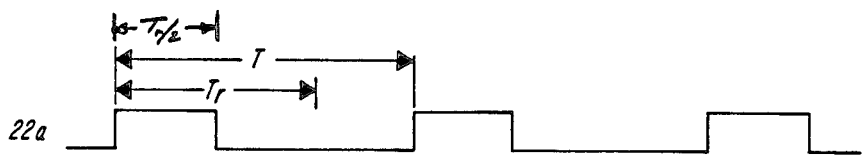
Figure 4B:
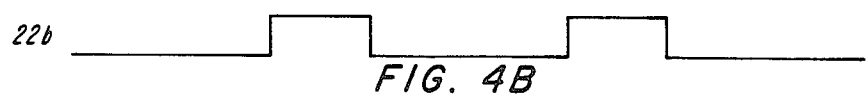
Figure 4C:
Figure 4D:
Figure 4E:
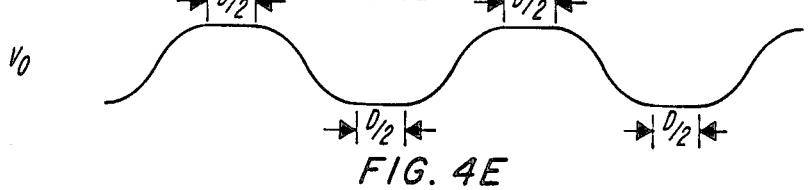

FIG. 3E shows the output voltage impressed across the capacitive element 12. At the maximum frequency where $f=f_r$, that voltage is nearly sinusoidal (where element 12 has high Q).

By way of further example, FIGS. 4A–4E similarly illustrate the operation of the system 10 of FIG. 2 where $L1=L2$, D is greater than zero, and the offset for network 20 equals $T/2$. In this case, the capacitive element charges up to a high peak voltage in a sinusoidal manner, stays charged for a "dead" time equal to $D/2$, discharges sinusoidally to a low peak value, stays charged for a dead time $D/2$, and then the cycle repeats.

Figure 5:
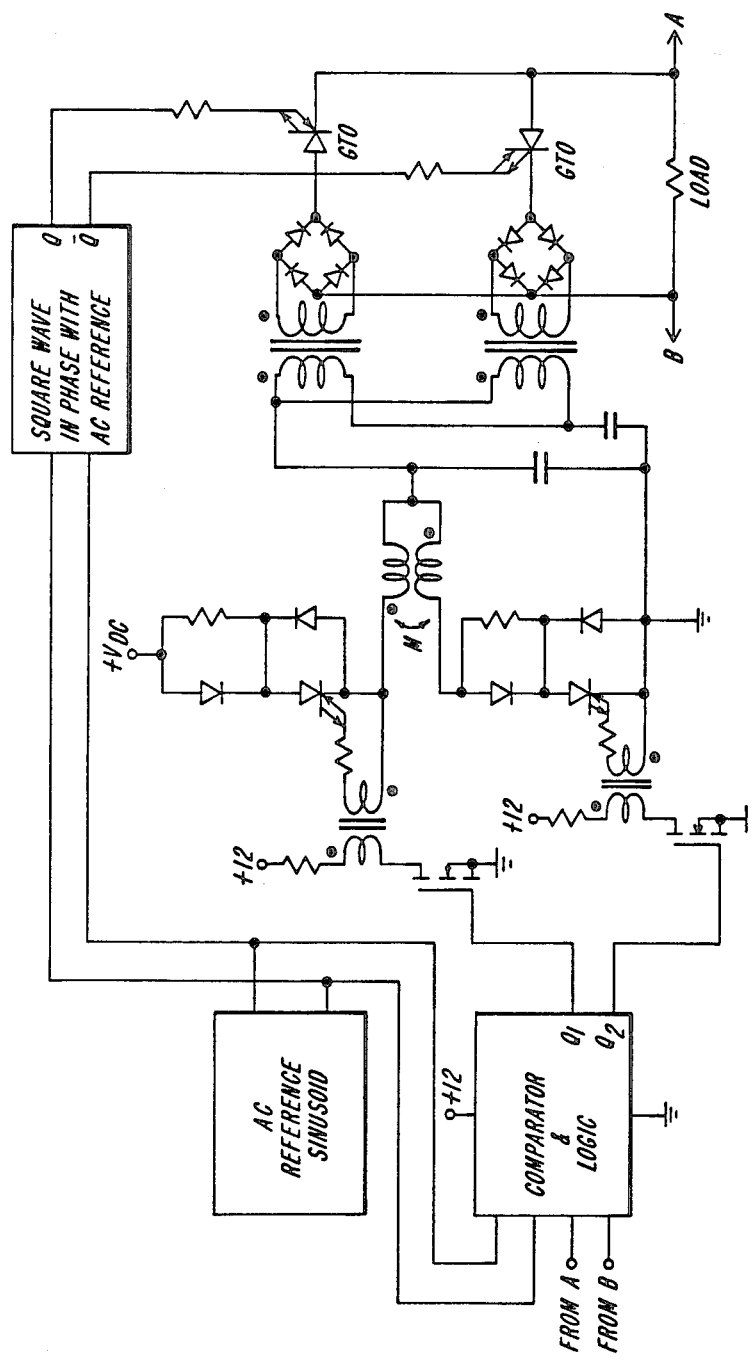
FIG. 5 shows in schematic form an DC-to-AC convertor embodying the present invention.

The system 10 of FIG. 2 is particularly suited for use in driving ultrasonic transducers, as noted above. The present invention, particularly the form with mutually coupled inductive elements, may also be used to provide a DC to AC converter as shown in FIG. 5. In that configuration, the voltage across terminals A,B is compared to a reference sinusoid (e.g. at 60 Hz voltage and the frequency of drive signals Q1 and Q2 increase when the voltage at A,B is less than the reference and decrease when the voltage at A,B is greater than the reference).

Figure 6:
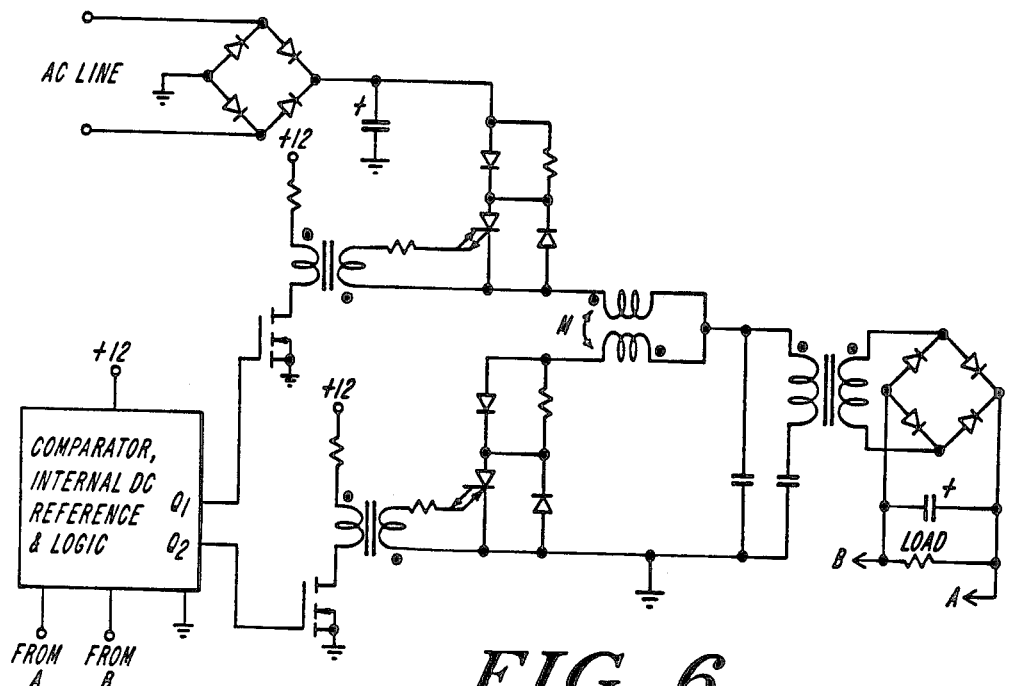
FIG. 6 shows in schematic form a DC power supply embodying the present invention.

The present invention may also be used as a DC power supply as shown in FIG. 6. In that configuration, the voltage across terminals A,B is compared to a reference DC voltage and the frequency of drive signals Q1 and Q2 increase when the voltage at A,B is less than the reference and decrease when the voltage at A,B is greater than the reference. The present invention may also be used in induction heating power supplies and DC-to-DC converters, as well as other circuits.

Figure 6A:
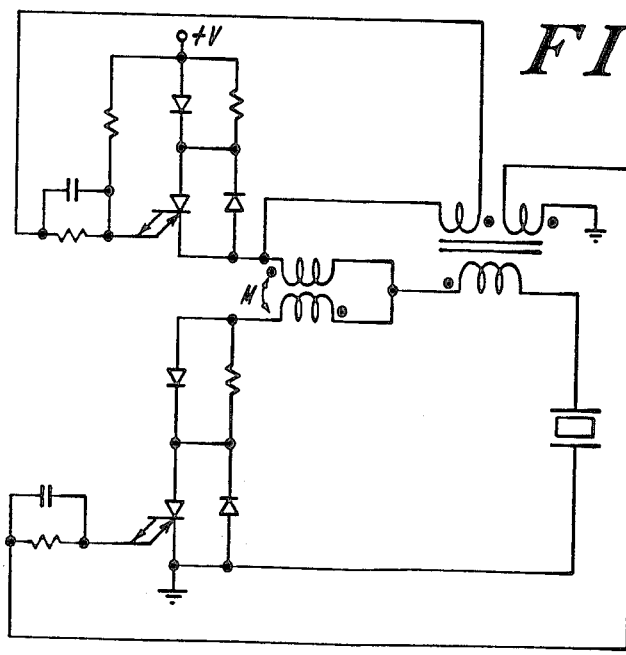
FIG. 6A shows a schematic form as self resonating circuit configuration embodying the present invention.

FIG. 6A shows yet another form of the present invention in a "half bridge" self resonating circuit configuration. The mutual inductance effect in this circuit eliminates the prior art problem of a current spike flowing from the power supply to ground through the circuits two switching devices (GTO's).

Figure 7:
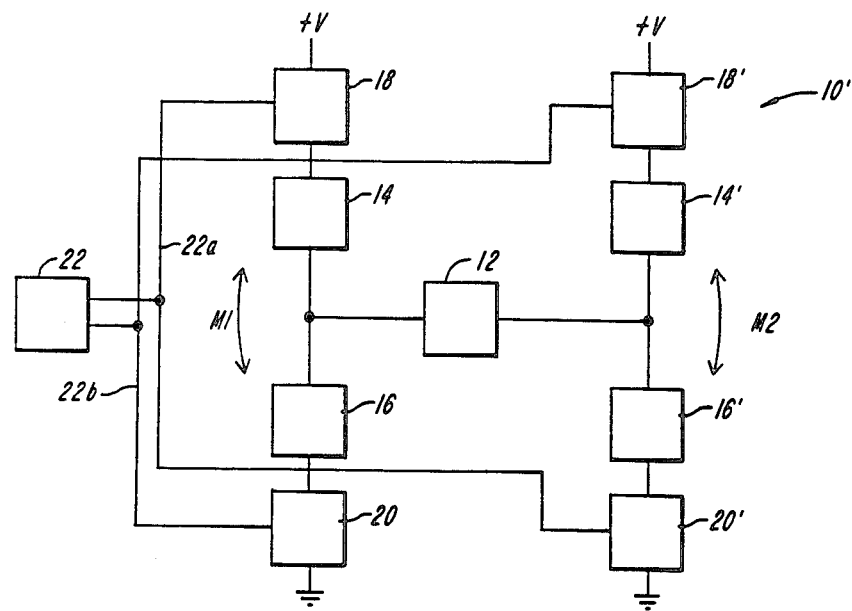
FIGS. 7 and 8 show in block diagram form alternate embodiments of the invention.
Figure 8:
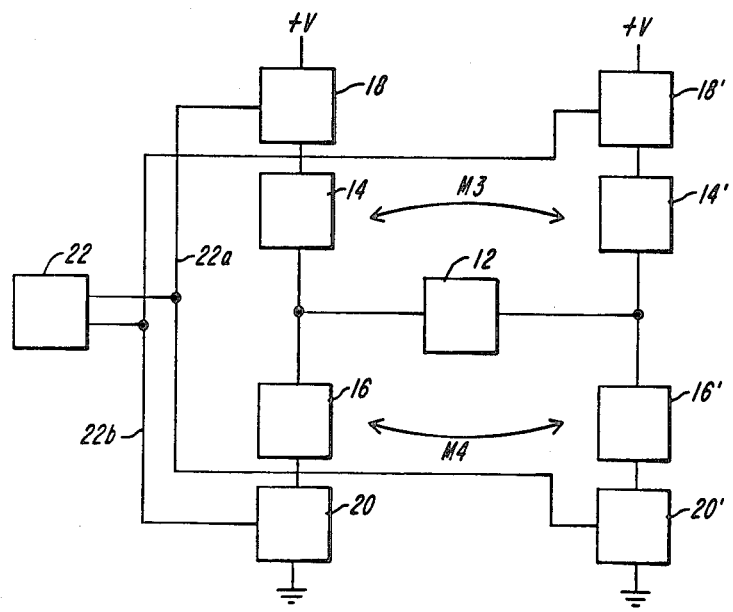

The embodiments shown in FIGS. 1 and 2 illustrate system 10 which is a "half bridge" form of the invention in which the drive networks 18 and 20 alternatively deliver one-half sinusoidal form power to the load capacitor element 12. FIGS. 7 and 8 show alternative systems 10' and 10" which are "full bridge" forms of the invention. In the latter figures, elements corresponding to similar elements in the configurations of FIGS. 1 and 2 are shown with identical reference designations. Each of systems 10' and 10" are configured with additional drive networks 18' and 20' which may be substantially the same as networks 18 and 20, except for the mutual inductances. In system 10' of FIG. 7, the inductive elements 14 and 16 are coupled with a mutual inductance M1 (which corresponds to the mutual inductance M of the embodiments of FIGS. 1 and 2) and the inductive elements 14' and 16' are coupled with a mutual inductance M2. In system 10" of FIG. 8, the inductive elements 14 and 14' are coupled with a mutual inductance M3 and the inductive elements 16 and 16' are coupled with a mutual inductance M4. In symmetrically configured systems, the inductance for each of elements 14, 14', 16 and 16' may be the same and the mutual inductance M1, M2, M3, and M4 may be the same. In other embodiments, these values may differ.

In operation, for each of systems 10' and 10'', the controller 22 alternatively switches drive networks 18 and 20' and drive networks 20 and 18' in the same manner that networks 18 and 20 are switched in the embodiment of FIG. 1. As a consequence, one-half sinusoidal form power is alternately delivered to the capacitance element 12.

Figure 9:
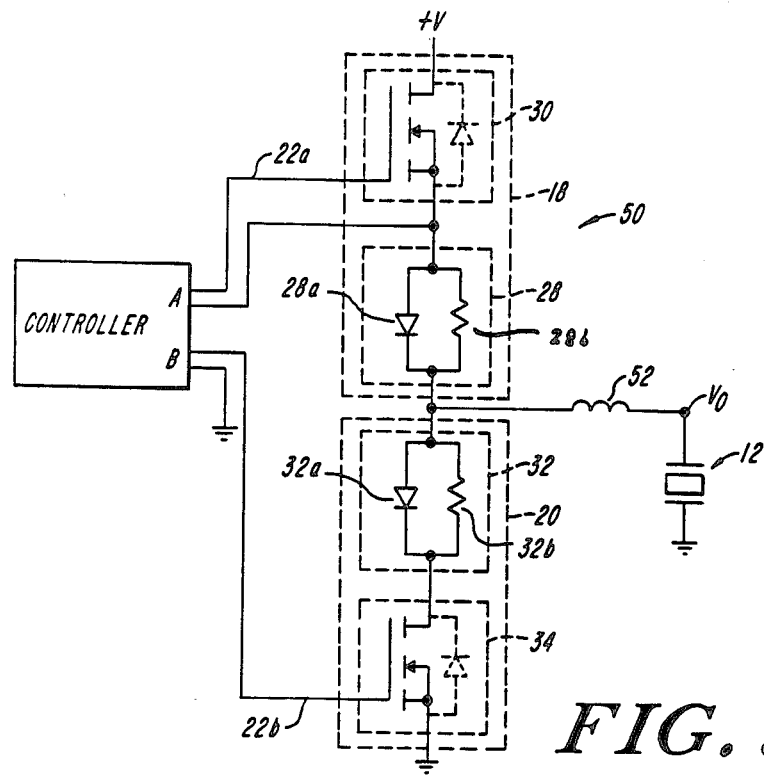
FIG. 9 shows in schematic form another AC power system embodying the present invention.

FIG. 9 shows another form of the present invention. The system 50 of FIG. 9 is similar to that shown in FIGS. 1 and 2, except that only a single inductor 52 is used in place of the mutually coupled inductors 14 and 16. The elements in FIG. 9 which correspond to similar elements in FIG. 2 are denoted by identical reference designations. The configuration of FIG. 9 is particularly useful with "fast" switching devices (such as bipolar transistors) which do not require an extended turn-off time as do GTO's.

Figure 10A:
FIGS. 10A-10C show waveforms illustrating the operation of the system of FIG. 9.
Figure 10B:
Figure 10C:
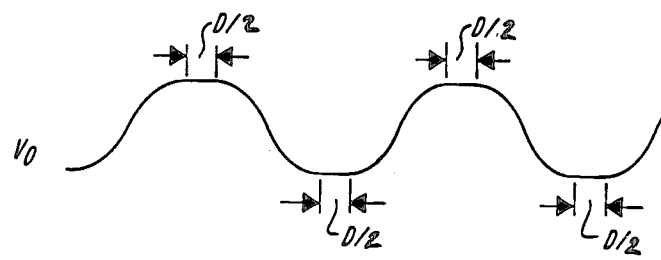

FIGS. 10A-10C show waveforms that illustrate the operation of the system 50 to provide a controlled frequency output voltage using resonant rise and fall with interspersed "dead" times (denoted by reference designations D). FIGS. 10A and 10B show the on-off control of the switch devices 30a and 34a and FIG. 10C shows the output voltage impressed across the capacitive element 12. As with the system 10, the system 50 may be used to drive ultrasonic transducers, and to function as a DC to AC converter and as a DC power supply.

Figure 11:
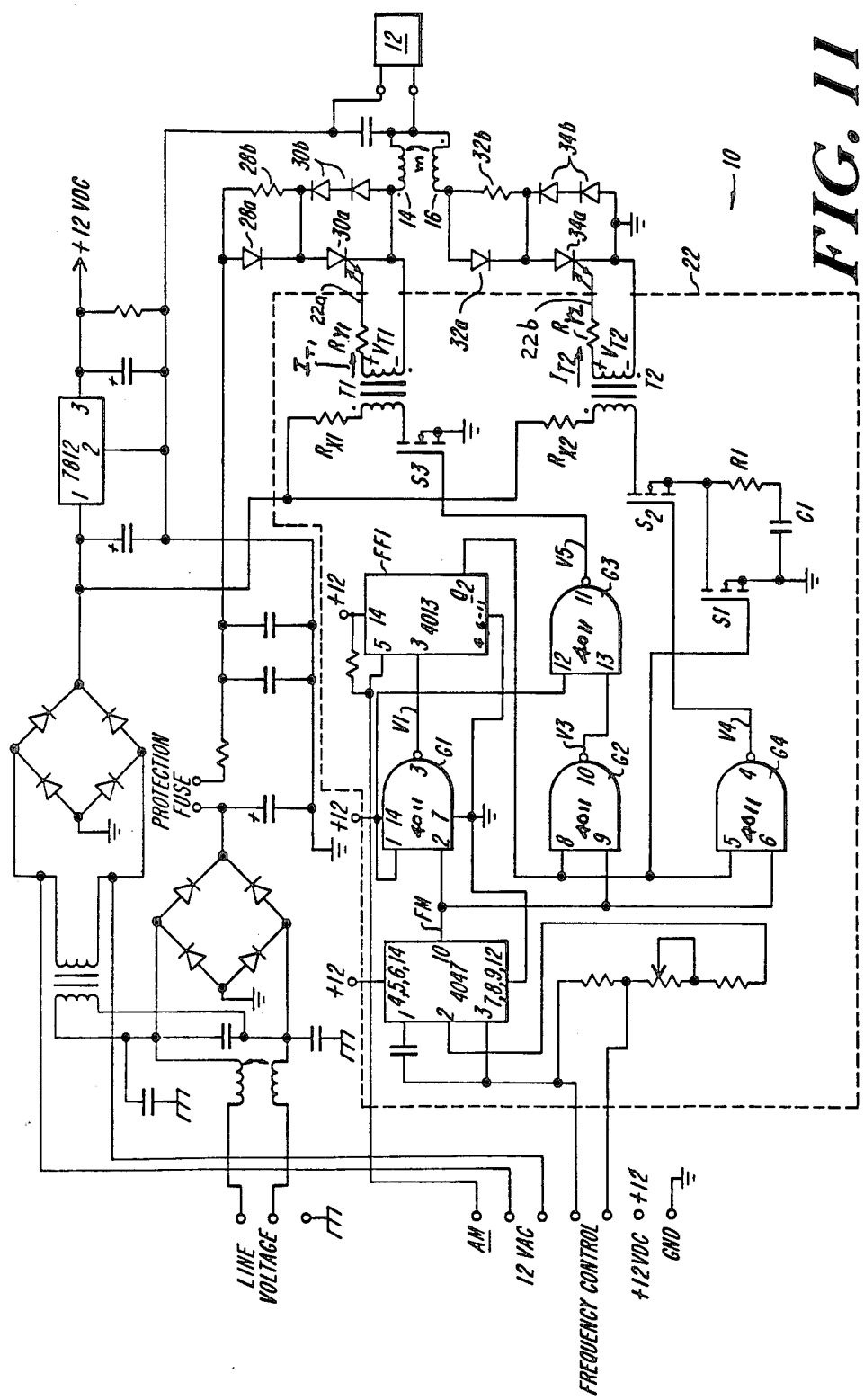
FIG. 11 shows in detailed schematic form an embodiment of the AC power system of FIG. 1.

FIG. 11 shows a detailed schematic representation of a thyristor-based power system in the form of system 10, as shown in FIG. 2.

Figure 12:
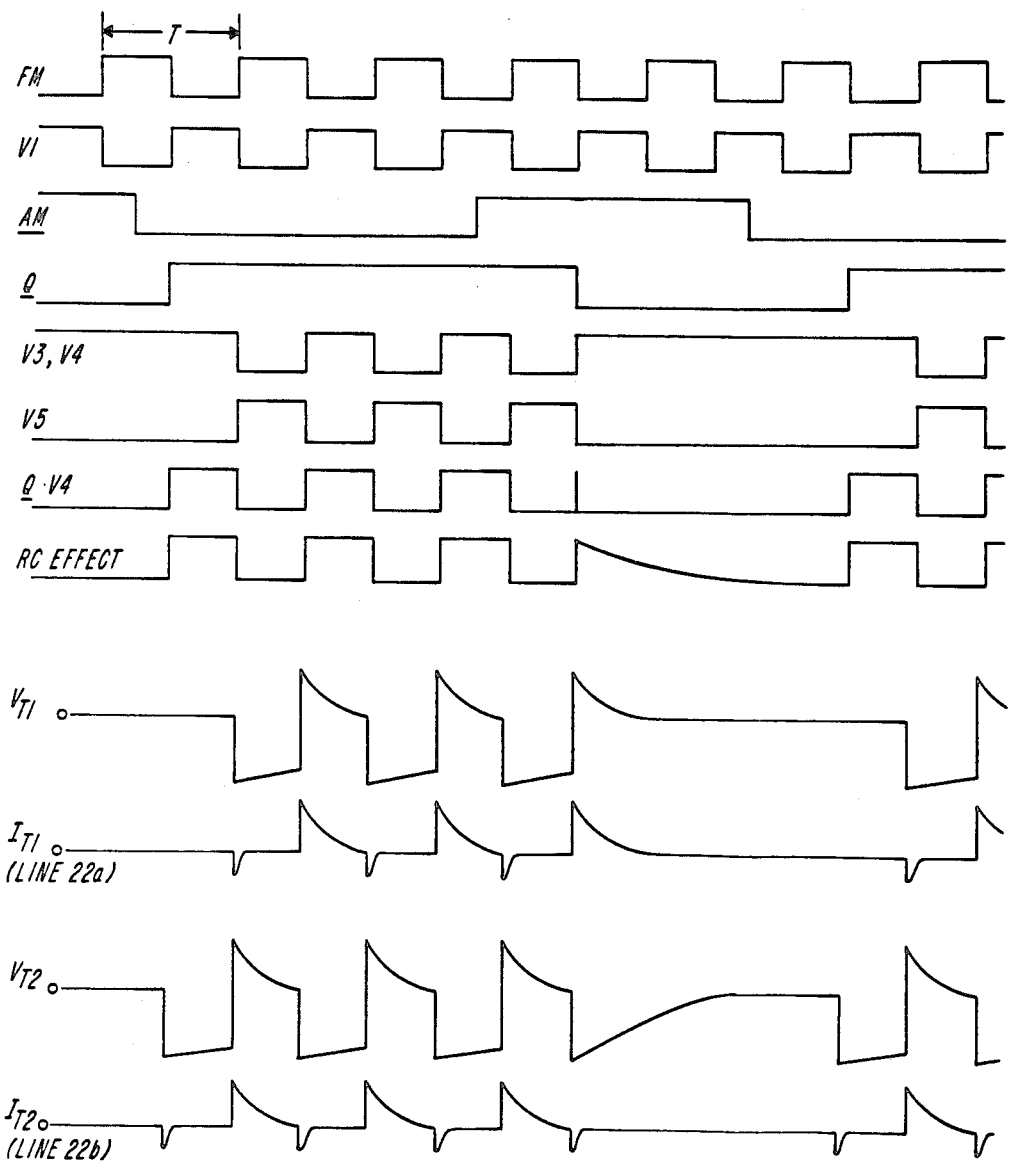
FIG. 12 shows waveforms illustrating the operation of the controller of the embodiment of FIG. 11.

FIG. 12 shows waveforms illustrating the operation of the controller 22 of FIG. 11. In FIG. 12, the signal FM provides the basic operating clock at frequency $f(=1/T)$.

The controller 22 of FIG. 11 is suitable for other types of power systems of the present invention, as well as for conventional systems, such as Class A SCR inverters of the form set forth in the above-referenced GE SCR Manual at pages 354-356. The controller 22 will now be described with reference to GTO switching devices, although other switching devices may readily be used.

The controller 22 supplies both the positive turn on pulse and the sustained negative gate bias from a single supply with a minimum of components. These pulses and bias appropriately timed, are provided by way of transformers T1 and T2 to the lines 22a and 22b. Two different modes of the transformers T1 and T2 are used in this function. During turn off for one of the switch devices 30a and 34a, the associated transformer is used in the conventional pulse transformer mode to supply the negative gate bias, providing a sustained negative turn off signal to the switch device. During turn on, the same components are used, but the inductive spike caused by the stored energy from the transformer's leakage inductance is used to provide a positive gate trigger signal. This gate trigger signal (having a fast rising leading edge) provides low loss turn-on and then a falling off of the signal providing relatively low gate loss during the on conduction time for the devices 30a and 34a. In contrast, conventional circuits use more components, typically reactive components, to simulate the turn-on and turn-off effects of the controller of FIG. 11.

The controller 22 of FIG. 11 includes digital logic elements which may be provided from two low cost CMOS integrated circuits, whereby the trigger signals may be turned off and back on at random (non-synchronized) times without causing interruption of the completion of a trigger cycle. In the illustrated configuration, the signal V3 and signal V4 are identical. Consequently, NAND gate G2 can be eliminated with the output of gate G4 being applied to both G3 and S2.

An FET switching device S1 and RC network (resistor R1 and capacitor C1) cause the controller 22 to assume states during the off time that makes the initial trigger pulses on start-up have the same characteristics as the trigger pulses have during steady state operation. This permits rapid turning on and off of the system (AM modulation) because the optimum wave shapes are always presented to the GTO gates. By way of example the signal AM in FIG. 12 controls system 10 to be alternately operative and inoperative for three consecutive periods of duration T.

Functionally, NAND gate G1 is configured as an inverter to drive the clock input of the D-type flip flop FF1 with the inverted FM signal V1. Flip flop FF1 transfers data on the D input to the output only on the rising edge of the clock pulse (as provided by V1).

The signal AM turns the trigger signals on and off. When AM is a low, trigger signals are generated, and when AM is high, no trigger signals are generated. The unsynchronized AM signal is always synchronized by the action of inverter G1 and flip flop FF1. (That is, Q of the flip flop FF1 only changes at the falling edge of the FM signal no matter when the AM signal changes).

To turn the system on, AM goes from high to low. At the next falling edge of FM, Q goes from low to high. This allows the FM signal to be gated through NAND gates G2 and G4. However, the output of those gates does not change until one-half cycle after Q changes. NAND gate G3 is an inverter which controls the drive signal (on line 22a) to the top switch 30a to be 180 degrees out of phase with the drive signal (on line 22b) to the bottom switch 34a.

The controller 22 operates as follows: When the gate of the FET S2 goes positive, +V is applied across the primary of the trigger transformer T2. Due to the winding polarity of the trigger transformer T2, a negative potential is generated on the secondary. As current builds up through the transformer's primary leakage inductance, a voltage drop across $R_{X2}$ causes a droop in the voltage across the secondary. This is illustrated on the negative portions of $V_{T1}$ and $V_{T2}$ in FIG. 12. When the gate of the FET S2 goes from high to low, the primary leakage current is shut off causing a rapid voltage rise on the drain of the FET S2. This voltage rises higher than +V due to the inductive kick and therefore the polarity of the voltage across the primary winding of the trigger transformer is reversed. As a consequence, a positive voltage spike is provided on the secondary winding. This spike decays to zero as the stored leakage inductance energy dissipates (i.e. the magnetic field collapses).

The minimum height of the positive trigger voltage spike is determined by $R_{X2}$ since this controls the height to which the leakage current builds and the height of the trigger current $I_{T1}$ (or $I_{T2}$) is controlled by $R_{Y1}$ (or $R_{Y2}$) because it limits the current that flows due to $V_{T1}$ (or $V_{T2}$). The value of the negative gate bias voltage is determined by the trigger transformer turns ratio.

In configurations without FET S1, capacitor C1 resistor R1, during the time AM is high, the FET S2 for the bottom trigger transformer would be constantly on, and therefore the current in the transformer leakage inductance would read a DC value equal to $+V/R_{X2}$ which is higher than the current reached under dynamic AC operation. Therefore, when AM goes low, the first trigger pulse would be higher than normal due to the excess energy in the higher DC leakage current. This makes the turn-off bias voltage lower in magnitude because the swing is constant ($+V$ times the turns ratio). This poor turn off voltage might cause the GTO not to turn off reliably on the first turn off pulse after an AM transition from high to low. If the GTO 34a does not turn off reliably, when the GTO 30a is triggered on, the power supply can be shorted to ground causing a fault condition.

In the preferred embodiment as shown in FIG. 11, the network 10 includes FET S1 and capacitor C1 and resistor R1 to avoid this potential condition. The leakage current in the trigger transformer primary is returned to zero after the AM transition to a high state. On startup, a normal negative bias occurs which builds up a proper leakage current for the correct height positive trigger voltage. Therefore, the first trigger signal following an off period is identical to steady state trigger signals. R1 and C1 are selected so the transition to no leakage current is slow so a positive trigger signal does not occur from an inductive kick.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An AC power system, comprising:
    A. a capacitive element, said capacitive element being characterized by a predetermined capacitance C, said capacitive element having a first terminal and a second terminal, said second terminal being coupled to a first reference potential,
    B. a first inductive element characterized by a first predetermined inductance L1 and a second inductive element characterized by a second predetermined inductance L2, each of said inductive elements having a first terminal and a second terminal, said first and second inductive elements being mutually coupled whereby a current flowing from said first terminal of one inductive element to the second terminal of said one inductive element induces a similarly directed current between said first and second terminals of the other inductive element,
    C. means for coupling both of said second terminals of said inductive elements to said first terminal of said capacitive element, whereby said first inductive element is electrically resonant with said capacitive element substantially at a resonant frequency $f_{r1}(=1/T_{r1})$ and said second inductive element is electrically resonant with said capacitive element substantially at a resonant frequency $f_{r2}(=1/T_{r2})$,
    D. a first drive network including a first multi-state switch network and a first blocking network coupled in series with said first inductive element between a second reference potential and said capacitive element,
    E. a second drive network including a second multi-state switch network and a second blocking network coupled in series with said second inductive element between a third reference potential and said capacitive element,
    wherein said second potential is greater than said third potential, and
    wherein said first drive network and said first inductive element provide a unidirectional current flow path characterized by a first relatively low impedance from said second potential to said capacitive element when said first switch network is in a first state, and provide a unidirectional current flow path characterized by a second relatively low impedance from said capacitive element to said second potential when said first switch network is in a second state, wherein said first relatively low impedance is lower than said second relatively low impedance,
    wherein said second drive network and said second inductive element provide a unidirectional current flow path characterized by a third relatively low impedance from said capacitive element to said third potential when said second switch network is in a first state, and provide a unidirectional current flow path characterized by a fourth relatively low impedance from said third potential to said capacitive element when said first switch network is in a second state, wherein said third relatively low impedance is lower than said fourth relatively low impedance, and
    further comprising:
    F. control means for:
        i. cyclically switching said first switch network between its first and second states at a frequency $f(=1/T)$, where $(T_{r1}/2)+(T_{r2}/2)$ is less than or equal to T whereby said first switch network is in its first state for a period substantially equal to $T_{r1}/2$ at the beginning of each cycle and is in its second state for the remainder of each cycle, and
        ii. cyclically switching said second switch network between its first and second states at said frequency f, whereby said second switch network is in its first state for a period substantially equal to $T_{r2}/2$ at the beginning of each cycle and is in its second state during the remainder of each cycle, wherein the start time for each cycle of said second switch network is offset by at least $T_{r1}/2$ and less than $T_{r1}/2+D$ from the start time for each cycle of said first switch network, where D is substantially equal to $T-(T_{r1}/2)-(T_{r2}/2)$,
    whereby an AC voltage at frequency f is impressed across said capacitive element.

2. An AC power system according to claim 1 wherein said capacitive element is an electrostrictive device.

3. An AC system according to claim 2 wherein said electrostrictive device is an ultrasonic transducer characterized by a mechanical resonant frequency $f_m$ substantially equal to f.

4. An AC power system according to claim 1 wherein at least one of said inductive elements is a magnetostrictive device.

5. An AC power system according to claim 1 wherein said magnetostrictive device is an ultrasonic transducer characterized by a mechanical resonant frequency $f_m$ substantially equal to f.

6. An AC power system according to claim 1 wherein both of said inductive elements are magnetostrictive devices.

7. An AC power system according to claim 1 wherein said magnetostrictive devices are ultrasonic transducers characterized by a mechanical resonant frequency $f_m$ substantially equal to f.

8. An AC power system according to claim 1 wherein said first blocking network includes a diode coupled in parallel with a resistive element, wherein said diode is connected so that in its forward conducting state a relatively low impedance current path is established in the direction from said second potential toward said capacitive element.

9. An AC power system according to claim 8 wherein said second blocking network includes a diode coupled in parallel with a resistive element, wherein said diode is connected so that in its forward conducting state a relatively low impedance current path is established in the direction from said capacitive element toward said third potential.

10. An AC power system according to claim 1 wherein said first switching network includes a semiconductor switch device having a conductive state and a non-conductive state coupled in parallel with a diode, wherein said switch device is connected so that in its conductive state a relatively low impedance current path in the direction from said second potential toward said capacitive element and said diode is connected so that in its forward conducting state an oppositely directed low impedance current flow path is established.

11. An AC power system according to claim 10 wherein said second switching network includes a semiconductor switch device having a conductive state and a non-conductive state coupled in parallel with a diode, wherein said switch device is connected so that in its conductive state a relatively low impedance current path in the direction from said capacitive element toward said third potential and said diode is connected so that in its forward conducting state an oppositely directed low impedance current flow path is established.

12. An AC power system according to claim 10 wherein each of said switch devices is a device selected from the group consisting of SCR's, GTO's, FET's, IGT's, and BJT's, wherein each of said devices has a control terminal adapted to change the state of said device in response to a switch signal applied to said control terminal.

13. An AC power system according to claim 11 wherein each of said switch devices is a device selected from the group consisting of SCR's, GTO's, FET's, IGT's, and BJT's, wherein each of said devices has a control terminal adapted to change the state of said device in response to a switch signal applied to said control terminal.

14. An AC power system according to claim 11 wherein said control means includes means for generating and applying a succession of switch signals to each of the control terminals of said switch devices, said succession having a repetition rate whereby said device cyclically changes states at said frequency f.

15. An AC power system according to claim 14 wherein said control means includes means for transformer coupling said succession of switch signals to the respective ones of said control terminals.

16. An AC power system according to claim 14 wherein said capacitive element is an ultrasonic transducer, characterized by a mechanical resonant frequency $f_m$, and said system further includes:
means for adaptively controlling said controller whereby the frequency f substantially matches said mechanical resonant frequency $f_m$.

17. An AC power system according to claim 1 wherein L1 substantially equals L2.

18. An AC power network comprising:
A. a capacitive element, said capacative element being characterized by a predetermined capacitance C,
B. a first inductive element characterized by a first inductance and a second inductive element characterized by a second inductance, said first and second inductive elements being coupled by a mutual inductance,
C. coupling means for coupling said first and second inductive elements to said capacitive element whereby a current in said first inductive element toward said capacitive element induces a current in said second inductive element toward said capacitive element and whereby said first inductive element is electrically resonant with said capacitive element substantially at a frequency $f_{r1}(=1/T_{r1})$ and said second inductive element is electrically resonant with said capacitive element substantially at a frequency $f_{r2}(=1/T_{r2})$,
D. a first drive network including a first multi-state switch network and a first blocking network including means operative in a first state for resonantly driving said first inductive element and said capacitive element and operative in a second state for substantially preventing energy transfer thereto from said first inductive element and said capacitive element,
E. a second drive network including a second multi-state switch network and a second blocking network including means operative in a first state for resonantly driving said second inductive element and said capacitive element and operative in a second state for substantially preventing energy transfer thereto from said second inductive element and said capacitive element,
F. control means for:
  i. cyclically switching said first switch network between its first and second states at a frequency $f(=1/T)$, where $(T_{r1}/2)+(T_{r2}/2)$ is less than or equal to T whereby said first switch network is in its first state for a period substantially equal to $T_{r1}/2$ at the beginning of each cycle and is in its second state for the remainder of each cycle, and
  ii. cyclically switching said second switch network between its first and second states at said frequency f, whereby said second switch network is in its first state for a period substantially equal to $T_{r2}/2$ at the beginning of each cycle and is in its second state during the remainder of each cycle, wherein the start time for each cycle of said second switch network is offset by at least $T_{r1}/2$ and less than $T_{r1}/2+D$ from the start time for each cycle of said first switch network, where D is substantially equal to $T-(T_{r1}/2)-(T_{r2}/2)$,
whereby an AC voltage at frequency f is impressed across said capacitive element.

19. An AC network according to claim 18 wherein said capacitive element includes a first terminal coupled to said drive networks and said first and second inductive elements and a second terminal coupled to a first reference potential, and whereby said AC network is a half bridge network.

20. An AC network according to claim 18 wherein said capacitive element includes a first terminal and a second terminal, and wherein said first inductive element includes a first inductor (L1), and a fourth inductor (L4) and said second inductive element includes a second inductor (L2) and a third inductor (L3), and wherein said coupling means includes:
  (i) means for coupling said first inductive element to said capacitive element whereby said first inductor is coupled to said first terminal of said capacitive element said fourth inductor is coupled to said second terminal of said capacitive element, and
  (ii) means for coupling said second inductive element to said capacitive element whereby said second inductor is coupled to said first terminal of said capacitive element and said third inductor is coupled to said second terminal of said capacitive element.

whereby said AC network is a full bridge network.

21. An AC network according to claim 20 wherein said coupling means establishes said mutual inductance between said first and second inductors and between said third and fourth inductors.

22. An AC network according to claim 20 wherein said coupling means establishes said mutual inductance between said first and third inductors and between said second and fourth inductors.

23. An AC power system, comprising:
  A. a capacitive element, said capacitive element being characterized by a predetermined capacitance C, said capacitive element having a first terminal and a second terminal, said second terminal being coupled to a first reference potential,
  B. an inductive element, said inductive element being characterized by a predetermined inductance L and having a first terminal and a second terminal,
  C. means for coupling said second terminal of said inductive element to said capacitive element, whereby said inductive element is electrically resonant with said capacitive element substantially at a resonant frequency $f_r(=1/T_r)$,
  D. a first drive network coupled between a second reference potential and said first terminal of said inductive element,
  E. a second drive network coupled between said first terminal of said inductive element and a third reference potential, wherein said second potential is greater than said third potential, and wherein said first drive network includes a first multi-state switch network and a first blocking network in series between said second reference potential and said first terminal of said first inductive element, said first drive network providing a unidirectional current flow path characterized by a first relatively low impedance from said second potential to said first terminal of said first inductive element when said first switch network is in a first state, and providing a unidirectional current flow path characterized by a second relatively low impedance from said first terminal of said first inductive element to said second potential when said first switch network is in a second state, wherein said first relatively low impedance is lower than said second relatively low impedance, wherein said second drive network includes a second switch network and a second blocking network in series between said first terminal of said second inductive element and said third reference potential, said second drive network providing a unidirectional current flow path characterized by a third relatively low impedance from said first terminal of said second inductive element to said third potential when said second switch network is in a first state, and providing a unidirectional current flow path characterized by a fourth relatively low impedance from said third potential to said first terminal of said second inductive element when said first switch network is in a second state, wherein said third relatively low impedance is lower than said fourth relatively low impedance, and further comprising:
  F. control means for:
    i. cyclically switching said first switch network between its first and second states at a frequency $f(=1/T)$, where f is lower than $f_r$, whereby said first switch network is in its first state for a period substantially equal to $(=T_r/2)$ at the beginning of each cycle and is in its second state for the remainder of each cycle, and
    ii. cyclically switching said second switch network between its first and second states at said frequency f, whereby said second switch network is in its first state for a period substantially equal to $(=T_r/2)$ at the beginning of each cycle and is in its second state during the remainder of each cycle, wherein the start time for each cycle of said second switch network is offset by at least $T/2$ and less than $T_r/2+D$ from the start time for each cycle of said first switch network, where D is substantially equal to $T-T_r$, whereby an AC voltage at frequency f is impressed across said capacitive element.

24. An AC power system according to claim 23 wherein said capacitive element is an electrostrictive device.

25. An AC system according to claim 24 wherein said electrostrictive device is an ultrasonic transducer characterized by a mechanical resonant frequency $f_m$ substantially equal to f.

26. An AC power system according to claim 23 wherein said inductive element is a magnetostrictive device.

27. An AC power system according to claim 23 wherein said magnetostrictive device is an ultrasonic transducer characterized by a mechanical resonant frequency $f_m$ substantially equal to f.

28. An AC power system according to claim 23 wherein said first blocking network includes a diode coupled in parallel with a resistive element, wherein said diode is connected so that in its forward conducting state a relatively low impedance current path is established in the direction from said second potential toward said capacitive element.

29. An AC power system according to claim 28 wherein said second blocking network includes a diode coupled in parallel with a resistive element, wherein said diode is connected so that in its forward conducting state a relatively low impedance current path is established in the direction from said capacitive element toward said third potential.

30. An AC power system according to claim 23 wherein said first switching network includes a semiconductor switch device having a conductive state and a non-conductive state coupled in parallel with a diode, wherein said switch device is connected so that in its conductive state a relatively low impedance current path in the direction from said second potential toward said capacitive element and said diode is connected so that in its forward conducting state an oppositely directed low impedance current flow path is established.

31. An AC power system according to claim 23 wherein said second switching network includes a semiconductor switch device having a conductive state and a non-conductive state coupled in parallel with a diode, wherein said switch device is connected so that in its conductive state a relatively low impedance current path in the direction from said capacitive element toward said third potential and said diode is connected so that in its forward conducting state an oppositely directed low impedance current flow path is established.

32. An AC power system according to claim 30 wherein each of said switch devices is a device selected from the group consisting of SCR's, GTO's, FET's, IGT's, and BJT's, wherein each of said devices has a control terminal adapted to change the state of said device in response to a switch signal applied to said control terminal.

33. An AC power system according to claim 31 wherein each of said switch devices is a device selected from the group consisting of SCR's, GTO's, FET's, IGT's, and BJT's, wherein each of said devices has a control terminal adapted to change the state of said device in response to a switch signal applied to said control terminal.

34. An AC power system according to claim 31 wherein said control means includes means for generating and applying a succession of switch signals to each of the control terminals of said switch devices, said succession having a repetition rate whereby said device cyclically changes states at said frequency f.

35. An AC power system according to claim 34 wherein said control means includes means for transformer coupling said succession of switch signals to the respective ones of said control terminals.

36. An AC power system according to claim 34 wherein said capacitive element is an ultrasonic transducer, characterized by a mechanical resonant frequency $f_m$, and said system further includes:

means for adaptively controlling said controller whereby the frequency f substantially matches said mechanical resonant frequency $f_m$.

37. A network for intermittently switching of first gate-turn off thyristor (GTO) and a second GTO out-of-phase between their conductive and non-conductive states, comprising:

a first trigger network for controlling the voltage across the gate and cathode of said first GTO, a second trigger network for controlling the voltage across the gate and cathode of said second GTO, wherein each of said first and second trigger networks includes:

A. an input switch, said input switch being relatively highly conductive in a first state and being substantially non-conductive in a second state, B. means for controlling the state of said input switch, C. a transformer having a primary winding and a secondary winding, D. first resistive element ($R_x$), E. second resistive element ($R_y$), F. input coupling means for coupling said input switch, said primary winding of said transformer and said first resistive element in series between a first reference potential and a second reference potential, G. output coupling means for coupling said secondary winding of said transformer in series with said second resistive element across said gate and cathode of said GTO, whereby when said input switch is in its first state a reverse bias voltage is applied across said gate and cathode to reverse bias said GTO, and in response to the switching of said input switch from its first to its second state, a relatively high and short inductively induced forward bias voltage pulse is applied across said gate and cathode to turn-on said GTO, said pulse decaying thereafter while said input switch remains in its second state, and further comprising:

a start up network coupled in series with the input coupling means of at least one of said trigger networks, said start-up network including:

(i) a series coupled resister (R1) and capacitor (C1) connected in parallel with a start-up switch, said start-up switch being substantially non-conductive in a first state and being relatively highly conductive in a second state, (ii) start-up controller including means for controlling said start-up switch to be in its first state immediately prior to and during said out-of-phase switching of said first and second GTO's and in its second state otherwise.

* * * * *